(12) United States Patent
Watanabe et al.

(10) Patent No.: US 9,175,942 B2
(45) Date of Patent: Nov. 3, 2015

(54) MAGNETIC SENSOR SYSTEM

(71) Applicant: TDK CORPORATION, Tokyo (JP)

(72) Inventors: Kazuya Watanabe, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 372 days.

(21) Appl. No.: 13/739,649

(22) Filed: Jan. 11, 2013

(65) Prior Publication Data

US 2014/0021943 A1    Jan. 23, 2014

(30) Foreign Application Priority Data

Jul. 18, 2012  (JP) .................................. 2012-159193

(51) Int. Cl.
*G01B 7/14*   (2006.01)
*G01B 7/30*   (2006.01)
*G01D 5/14*   (2006.01)
*G01R 33/09*  (2006.01)

(52) U.S. Cl.
CPC  *G01B 7/30* (2013.01); *G01D 5/145* (2013.01); *G01R 33/093* (2013.01)

(58) Field of Classification Search
CPC ........................................................ G01B 7/30
USPC ................................................... 324/207.21
See application file for complete search history.

(56) References Cited

U.S. PATENT DOCUMENTS

| | | | |
|---|---|---|---|
| 6,028,730 A * | 2/2000 | Ishihara ........................... | 360/66 |
| 7,394,248 B1 | 7/2008 | Guo et al. | |
| 7,483,295 B2 | 1/2009 | Guo et al. | |
| 7,852,070 B2 * | 12/2010 | Yamada et al. .......... | 324/207.25 |
| 8,054,067 B2 * | 11/2011 | Okada et al. ............. | 324/207.21 |
| 2010/0090633 A1 * | 4/2010 | Deller et al. ............. | 318/400.39 |
| 2010/0213933 A1 * | 8/2010 | Mather et al. ................. | 324/252 |
| 2011/0163739 A1 * | 7/2011 | Ono et al. ................ | 324/207.21 |
| 2012/0069474 A1 * | 3/2012 | Takagishi et al. ............. | 360/244 |
| 2012/0095712 A1 | 4/2012 | Komasaki et al. | |
| 2012/0286382 A1 * | 11/2012 | Jan et al. ........................ | 257/421 |
| 2013/0335073 A1 * | 12/2013 | Deak et al. ............... | 324/207.21 |

FOREIGN PATENT DOCUMENTS

| | | |
|---|---|---|
| DE | 10 2011 083 249 A1 | 4/2012 |
| DE | 11 2010 000 890 T5 | 9/2012 |
| WO | WO 00/17666 A1 | 3/2000 |

OTHER PUBLICATIONS

Jul. 15, 2013 German Office Action issued in German Application No. 10 2013 102 165.4 (with translation).

* cited by examiner

*Primary Examiner* — Benjamin M Baldridge
(74) *Attorney, Agent, or Firm* — Oliff PLC

(57) ABSTRACT

A magnetic sensor system includes a magnetic field generation unit for generating a target magnetic field and a magnetic sensor for detecting the target magnetic field, and is selectable between an operating state and a non-operating state. The magnetic sensor has a magnetic detection element including a magnetic layer whose magnetization direction varies according to the direction of the target magnetic field in a reference position. When in the operating state, the direction of the target magnetic field in the reference position varies when viewed from the magnetic sensor. When in the non-operating state, the direction of the target magnetic field in the reference position does not vary when viewed from the magnetic sensor and the magnetization direction of the magnetic layer is pinned in a first direction. The magnetic layer has an induced magnetic anisotropy that is imparted in advance to the magnetic layer.

6 Claims, 8 Drawing Sheets

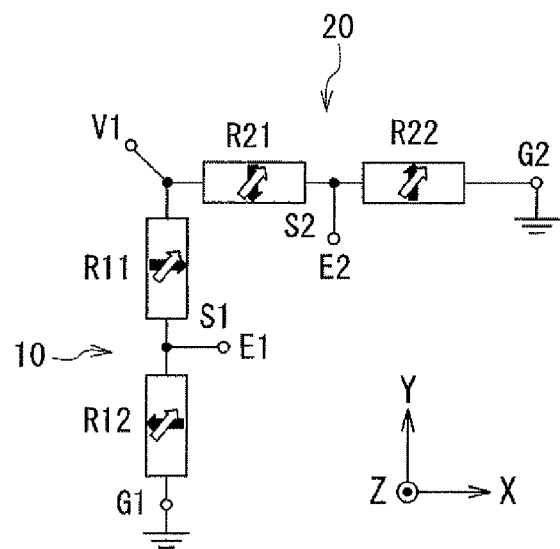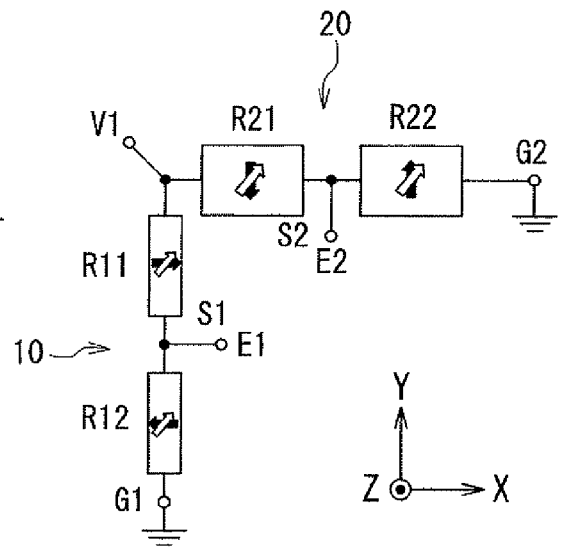
FIG. 14A
RELATED ART
FIG. 14B
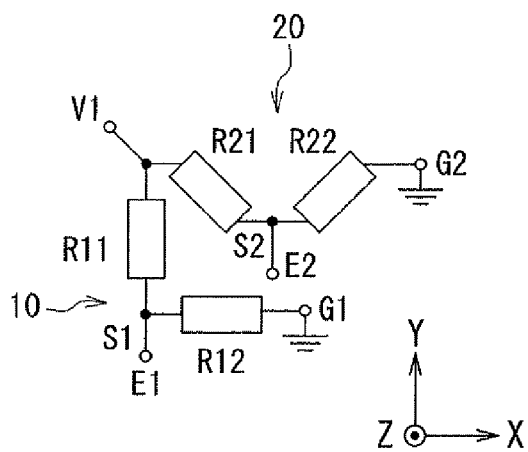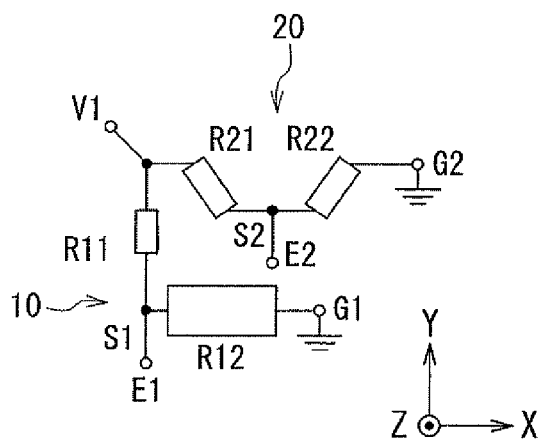
FIG. 15A
RELATED ART
FIG. 15B

MAGNETIC SENSOR SYSTEM

BACKGROUND OF THE INVENTION

1. Field of the Invention

The present invention relates to a magnetic sensor system including a magnetic field generation unit for generating a magnetic field to be detected and a magnetic sensor for detecting the magnetic field.

2. Description of the Related Art

In recent years, magnetic sensors have been widely used to detect the rotational position of an object in a variety of applications such as detection of the degree of opening of a throttle valve in automobiles, detection of the rotational position of steering in automobiles, and detection of the rotational position of the wiper of automobiles. Magnetic sensors are used not only to detect the rotational position of an object but also to detect a linear displacement of an object. Systems using magnetic sensors are typically provided with means (for example, a magnet) for generating a magnetic field to be detected whose direction rotates in conjunction with the rotation or linear movement of an object. Hereinafter, the magnetic field to be detected will be referred to as the target magnetic field. The magnetic sensors use magnetic detection elements to detect the angle that the direction of the target magnetic field in a reference position forms with respect to a reference direction. The rotational position or linear displacement of an object is thus detected.

Among known magnetic sensors is one that employs a spin-valve magnetoresistive (MR) element as the magnetic detection element, as disclosed in WO 00/17666, U.S. Pat. No. 7,483,295 B2, U.S. Pat. No. 7,394,248 B1, and U.S. Pat. No. 8,054,067 B2. The spin-valve MR element has a magnetization pinned layer whose magnetization direction is pinned, a free layer whose magnetization direction varies according to the direction of the target magnetic field, and a nonmagnetic layer disposed between the magnetization pinned layer and the free layer.

A magnetic sensor that employs a spin-valve MR element as the magnetic detection element may have an error in a detected angle due to variations in the magnetic properties of the MR element, as described in U.S. Pat. No. 8,054,067 B2. U.S. Pat. No. 8,054,067 B2 discloses a technology for reducing an error in the detected angle caused by manufacturing variations in MR elements. This technology is, so to speak, a technology for reducing an error in the detected angle that will be found at the time of completion of the magnetic sensor as a product.

Errors in the detected angle that could occur in the magnetic sensor include an error that emerges after the installation of the magnetic sensor in addition to an error found at the time of completion of the product as mentioned above. One of the causes by which an error in the detected angle emerges after the installation of the magnetic sensor is an induced magnetic anisotropy that occurs on an a posteriori basis in the free layer of the MR element. Such an induced magnetic anisotropy may occur in the free layer when, for example, the temperature of the MR element is lowered from a high temperature while an external magnetic field is being applied to the MR element in a particular direction. Such a situation may occur when, for example, the magnetic sensor is installed in an automobile and a specific positional relationship is established between the magnetic sensor and means for generating a target magnetic field during non-operation of the automobile. More specifically, the aforementioned situation may occur when the magnetic sensor is used to detect the position of an object that comes to a standstill in a predetermined position during non-operation of the automobile, such as the wiper of an automobile.

The magnetic sensor is required to have a reduced error in the detected angle that may emerge due to an induced magnetic anisotropy occurring on an a posteriori basis after the installation. Note that the foregoing descriptions have dealt with the problem that is encountered when an induced magnetic anisotropy occurs on an a posteriori basis in the free layer of a spin-valve MR element after the installation of a magnetic sensor that employs the spin-valve MR element as the magnetic detection element. However, this problem applies to any cases where the magnetic sensor has a magnetic detection element that includes a magnetic layer whose magnetization direction varies according to the direction of the target magnetic field and an induced magnetic anisotropy occurs on an a posteriori basis in the magnetic layer of the magnetic detection element after the installation of the magnetic sensor.

OBJECT AND SUMMARY OF THE INVENTION

It is an object of the present invention to provide a magnetic sensor system including a magnetic field generation unit for generating a target magnetic field and a magnetic sensor having a magnetic detection element including a magnetic layer, the magnetic sensor system being capable of reducing an error that may occur in the detected value due to an induced magnetic anisotropy occurring on an a posteriori basis in the magnetic layer of the magnetic detection element.

A magnetic sensor system of the present invention includes a magnetic field generation unit for generating a target magnetic field and a magnetic sensor for detecting the target magnetic field, and is selectable between an operating state and a non-operating state. The magnetic sensor has a magnetic detection element, and generates a detected value having a correspondence relationship with the angle that the direction of the target magnetic field in a reference position forms with respect to a reference direction. The magnetic detection element includes a magnetic layer whose magnetization direction varies according to the direction of the target magnetic field in the reference position. When the magnetic sensor system is in the operating state, the direction of the target magnetic field in the reference position varies when viewed from the magnetic sensor. When the magnetic sensor system is in the non-operating state, the direction of the target magnetic field in the reference position does not vary when viewed from the magnetic sensor and the magnetization direction of the magnetic layer is pinned in a first direction. The magnetic layer has an induced magnetic anisotropy that is imparted in advance to the magnetic layer. An easy axis of magnetization resulting from the induced magnetic anisotropy imparted to the magnetic layer is oriented in a direction that forms an angle in the range of 0° to 15° with respect to the first direction.

When the magnetic sensor system of the present invention is in the operating state, the magnetic field generation unit and the magnetic sensor may be in a varying relative positional relationship with each other, whereas when the magnetic sensor system is in the non-operating state, the magnetic field generation unit and the magnetic sensor may be in a fixed relative positional relationship with each other.

In the magnetic sensor system of the present invention, the magnetic sensor may make a correction of an error that occurs in the detected value due to the induced magnetic anisotropy imparted to the magnetic layer. The correction of the error may be implemented by a shape magnetic anisotropy imparted to the magnetic layer. In this case, an easy axis of magnetization resulting from the shape magnetic anisotropy may be oriented in a direction that forms an angle in the range of 75° to 90° with respect to both of the first direction and the direction of the easy axis of magnetization resulting from the induced magnetic anisotropy. Alternatively, the magnetic sensor may include an arithmetic circuit for making the correction of the error.

In the magnetic sensor system of the present invention, an induced magnetic anisotropy is imparted in advance to the magnetic layer. Thus, according to the present invention, the magnetic layer is less increased in the magnitude of an induced magnetic anisotropy that may be caused in the magnetic layer by an a posteriori factor when compared with the case where no induced magnetic anisotropy is imparted in advance to the magnetic layer. Consequently, according to the present invention, it is possible to reduce an error in the detected value caused by an induced magnetic anisotropy that occurs on an a posteriori basis in the magnetic layer of the magnetic detection element.

Other and further objects, features and advantages of the present invention will appear more fully from the following description.

BRIEF DESCRIPTION OF THE DRAWINGS

FIG. 14A is a circuit diagram illustrating the configuration of a magnetic sensor of a comparative example against a fourth embodiment of the invention.

FIG. 14B is a circuit diagram illustrating the configuration of a magnetic sensor of the fourth embodiment of the invention.

FIG. 15A is a circuit diagram illustrating the configuration of a magnetic sensor of a comparative example against a fifth embodiment of the invention.

FIG. 15B is a circuit diagram illustrating the configuration of a magnetic sensor of the fifth embodiment of the invention.

DETAILED DESCRIPTION OF THE PREFERRED EMBODIMENTS

[First Embodiment]

Figure 1:
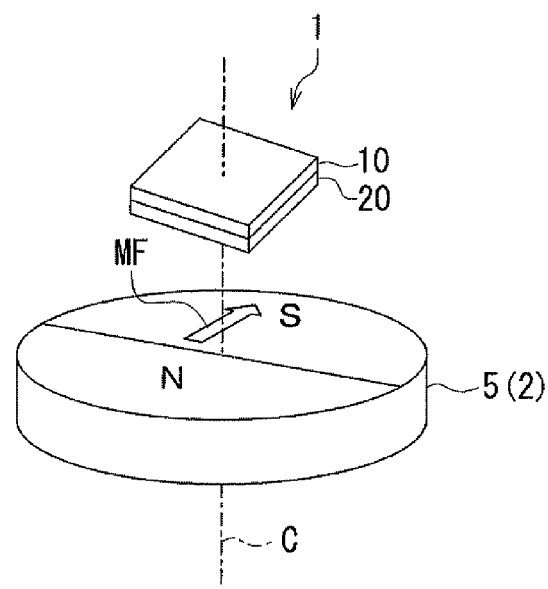
FIG. 1 is a perspective view illustrating the general configuration of a magnetic sensor system according to a first embodiment of the invention.
Figure 2:
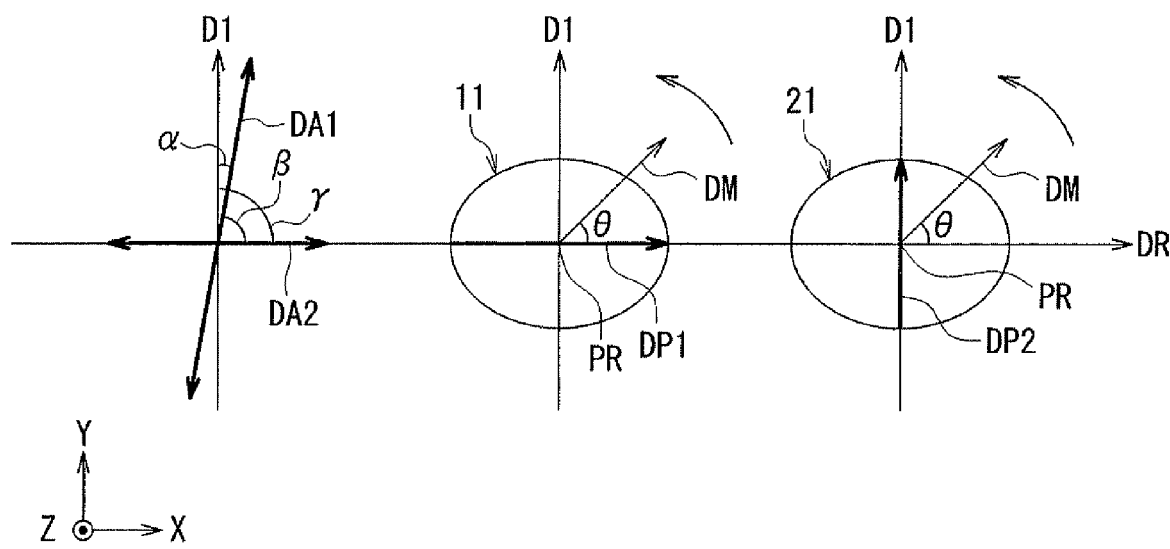
FIG. 2 is an explanatory diagram illustrating the definitions of directions and angles in the first embodiment of the invention.
Figure 3:
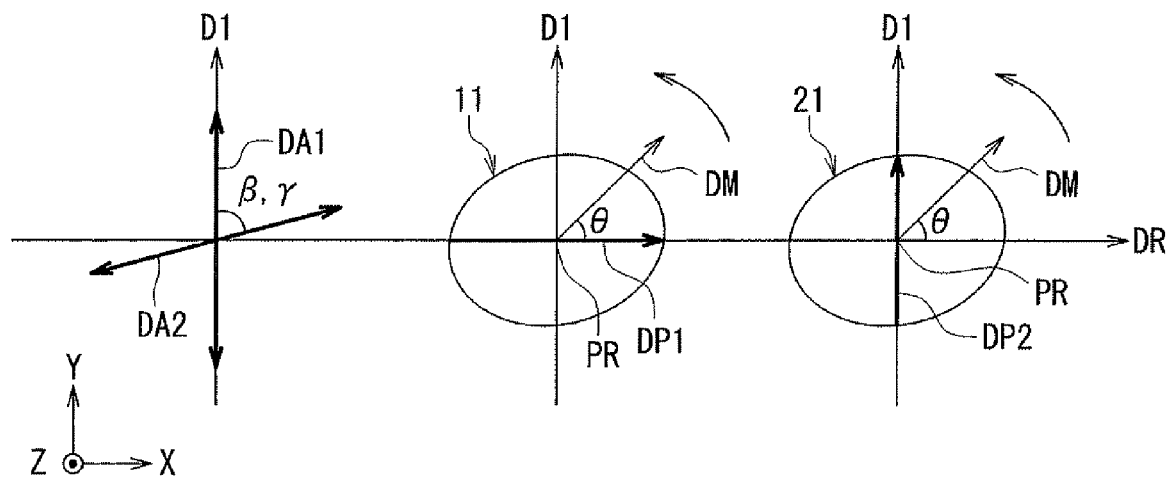
FIG. 3 is an explanatory diagram illustrating the definitions of directions and angles in the first embodiment of the invention.

Preferred embodiments of the present invention will now be described in detail with reference to the drawings. First, reference is made to FIG. 1 to FIG. 3 to describe the general configuration of a magnetic sensor system according to a first embodiment of the invention. FIG. 1 is a perspective view illustrating the general configuration of the magnetic sensor system according to the present embodiment. FIG. 2 and FIG. 3 are explanatory diagrams illustrating the definitions of directions and angles in the present embodiment.

As shown in FIG. 1, the magnetic sensor system according to the present embodiment includes a magnetic field generation unit 2 for generating a target magnetic field MF and a magnetic sensor 1 for detecting the target magnetic field MF. The magnetic sensor 1 includes a first detection circuit 10 and a second detection circuit 20 for detecting the target magnetic field MF. For ease of understanding, FIG. 1 illustrates the first and second detection circuits 10 and 20 as separate components. However, the first and second detection circuits 10 and 20 may be integrated into a single component. The first and second detection circuits 10 and 20 are stacked vertically in FIG. 1, and the order of stacking may be reversed from that shown in FIG. 1.

Here, a reference plane, a reference position, and a reference direction will be defined as follows. The reference plane is a virtual plane having a predetermined positional relationship with the magnetic sensor 1. The reference position is located within the reference plane. The reference direction is located within the reference plane and intersects the reference position. A direction that is the direction of the target magnetic field MF in the reference position and that is located within the reference plane can vary when viewed from the magnetic sensor 1. In the following descriptions, the direction of the target magnetic field MF in the reference position refers to a direction that is located within the reference plane. The direction of the target magnetic field MF in the reference position is, for example, rotatable about the reference position when viewed from the magnetic sensor 1. The magnetic sensor 1 generates a detected value having a correspondence relationship with the angle that the direction of the target magnetic field MF in the reference position forms with respect to the reference direction.

In the present embodiment, the magnetic field generation unit 2 has a cylindrical magnet 5. The magnet 5 has an N pole and an S pole that are arranged symmetrically about a virtual plane including the central axis of the cylinder. The magnet 5 is rotatable about the central axis of the cylinder. The magnet 5 has two end faces that are located at opposite ends of the magnet 5 in the direction of the central axis of the cylinder. The magnetic sensor 1 is disposed to face one of the two end faces of the magnet 5. In the present embodiment the reference plane is, for example, a plane parallel to the one of the two end faces of the magnet 5. Further, the reference position is, for example, the position in which the magnetic sensor 1 detects the target magnetic field MF. The reference position may be the position in which a center of rotation C including the central axis of the cylinder intersects the reference plane. In this case, when the magnet 5 rotates, the direction of the target magnetic field MF in the reference position rotates about the reference position when viewed from the magnetic sensor 1.

The first detection circuit 10 includes a magnetic detection element and generates a first signal S1 having a correspondence relationship with the angle that the direction of the target magnetic field MF in the reference position forms with respect to the reference direction. The second detection circuit 20 includes a magnetic detection element and generates a second signal S2 having a correspondence relationship with the angle that the direction of the target magnetic field MF in the reference position forms with respect to the reference direction. The magnetic detection element of each of the first and second detection circuits 10 and 20 includes a magnetic layer whose magnetization direction varies according to the direction of the target magnetic field MF in the reference position.

The magnetic sensor system is selectable between the operating state and the non-operating state. When the magnetic sensor system is in the operating state, the direction of the target magnetic field MF in the reference position varies when viewed from the magnetic sensor 1. In the present embodiment, in particular, when the magnetic sensor system is in the operating state, the direction of the target magnetic field MF in the reference position rotates about the reference position when viewed from the magnetic sensor 1. When the magnetic sensor system is in the non-operating state, the direction of the target magnetic field MF in the reference position does not vary when viewed from the magnetic sensor 1, and the magnetization direction of the magnetic layer is pinned in a first direction to be described later.

The configuration of the magnetic sensor system is not limited to the example shown in FIG. 1. The magnetic sensor system need only be such one that when in the operating state the direction of the target magnetic field MF in the reference position varies when viewed from the magnetic sensor 1, whereas when in the non-operating state the direction of the target magnetic field MF in the reference position does not vary when viewed from the magnetic sensor 1 and the magnetization direction of the magnetic layer is pinned in the first direction. For example, such a magnetic sensor system may be configured so that when in the operating state the magnetic field generation unit 2 and the magnetic sensor 1 are in a varying relative positional relationship with each other, whereas when in the non-operating state the magnetic field generation unit 2 and the magnetic sensor 1 are in a fixed relative positional relationship with each other. The magnetic sensor system shown in FIG. 1 is one example thereof.

The magnetic sensor system, where it includes the magnet 5 and the magnetic sensor 1 that are arranged as shown in, for example, FIG. 1, may be configured so that when in the operating state, the magnet 5 is fixed while the magnetic sensor 1 rotates, or the magnet 5 and the magnetic sensor 1 rotate in opposite directions, or the magnet 5 and the magnetic sensor 1 rotate in the same direction but at mutually different angular velocities.

The magnetic sensor system may also be configured so that the magnetic field generation unit 2 does not have the magnet 5 but has a magnet including one or more pairs of N and S poles arranged alternately in an annular shape, with the magnetic sensor 1 disposed in the vicinity of the outer circumference of the magnet. In this case, for example, when the magnetic sensor system is in the operating state, at least one of the magnet and the magnetic sensor 1 may rotate whereas when in the non-operating state, both the magnet and the magnetic sensor 1 may be at a standstill.

The magnetic sensor system may also be configured so that the magnetic field generation unit 2 does not have the magnet 5 but has a magnetic scale including a plurality of pairs of N and S poles arranged alternately in a straight line, with the magnetic sensor 1 disposed in the vicinity of the periphery of the magnetic scale. In this case, for example, when the magnetic sensor system is in the operating state, at least one of the magnetic scale and the magnetic sensor 1 may move linearly in the direction in which the N and S poles of the magnetic scale are aligned, whereas when in the non-operating state, both the magnetic scale and the magnetic sensor 1 may be at a standstill. This example will be described later in more detail as a third embodiment.

The reference plane, the reference position, and the reference direction can be assumed also in the aforementioned various types of configurations of the magnetic sensor system.

The definitions of directions and angles in the present embodiment will now be described with reference to FIG. 2 and FIG. 3. First, a direction that is parallel to the center of rotation C shown in FIG. 1 and is from one of the two end faces of the magnet 5 to the magnetic sensor 1 will be defined as the Z direction. Next, two directions that are orthogonal to each other and perpendicular to the Z direction will be defined as the X direction and the Y direction. In FIG. 2, the X direction is shown as the direction toward the right, and the Y direction is shown as the upward direction. The direction opposite to the X direction will be defined as the −X direction, and the direction opposite to the Y direction will be defined as the −Y direction.

Here, the reference position PR shall be the position in which the magnetic sensor 1 detects the target magnetic field MF. The reference direction DR shall be the X direction. The angle that the direction DM of the target magnetic field MF in the reference position PR forms with respect to the reference direction DR will be designated by symbol θ. The direction DM of the target magnetic field MF shall rotate counterclockwise in FIG. 2. The angle θ will be expressed in a positive value when viewed counterclockwise from the reference direction DR, and in a negative value when viewed clockwise from the reference direction DR.

In the present embodiment, when the magnetic sensor system is in the non-operating state, the direction DM of the target magnetic field MF in the reference position PR is pinned in the first direction D1, and consequently the magnetization direction of the magnetic layer is also pinned in the first direction D1. In the present embodiment, the first direction D1 shall be the Y direction.

Figure 4:
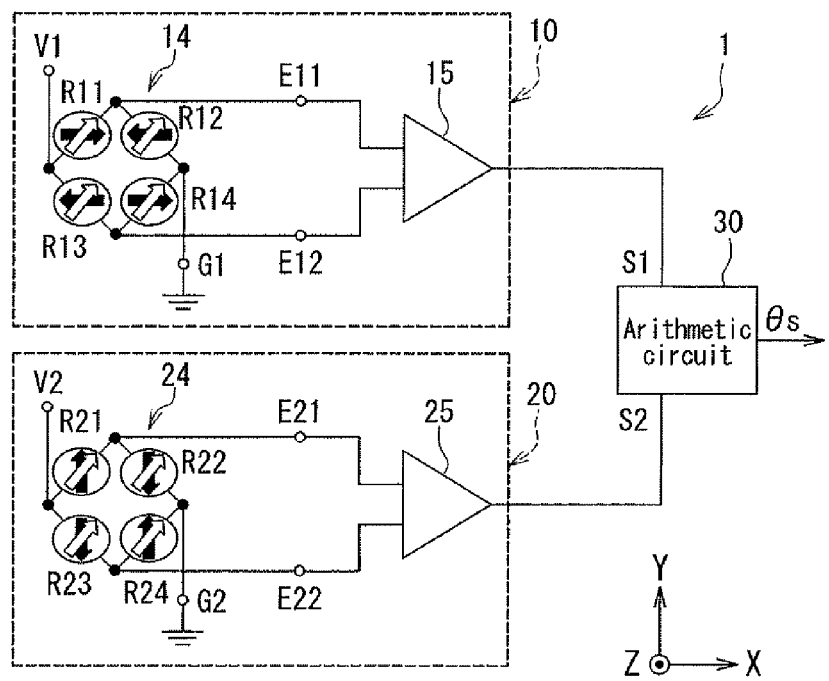
FIG. 4 is a circuit diagram illustrating the configuration of a magnetic sensor of the first embodiment of the invention.

Next, the configuration of the magnetic sensor 1 will be described in detail with reference to FIG. 4. FIG. 4 is a circuit diagram illustrating the configuration of the magnetic sensor 1. The first detection circuit 10 detects an X-direction component of the target magnetic field MF in the reference position PR and generates the first signal S1 having a correspondence relationship with the angle θ. The second detection circuit 20 detects a Y-direction component of the target magnetic field MF in the reference position PR and generates the second signal S2 having a correspondence relationship with the angle θ. The first signal S1 is a signal associated with the strength of the X-direction component of the target magnetic field MF in the reference position PR. The second signal S2 is a signal associated with the strength of the Y-direction component of the target magnetic field MF in the reference position PR.

The first and second signals S1 and S2 vary periodically with the same signal period T. The second signal S2 differs from the first signal S1 in phase. In the present embodiment, the second signal S2 preferably differs from the first signal S1 in phase by an odd number of times ¼ the signal period T. However, in consideration of the production accuracy of the magnetic detection elements and other factors, the difference in phase between the first signal S1 and the second signal S2 can be slightly different from an odd number of times ¼ the signal period T. The following description assumes that the phases of the first signal S1 and the second signal S2 satisfy the aforementioned preferred relationship.

The first detection circuit 10 has an output for outputting the first signal S1. The second detection circuit 20 has an output for outputting the second signal S2. As shown in FIG. 4, the magnetic sensor 1 further includes an arithmetic circuit 30. The arithmetic circuit 30 has two inputs and an output. The two inputs of the arithmetic circuit 30 are connected to the respective outputs of the first and second detection circuits 10 and 20.

The arithmetic circuit 30 computes a detected value θs having a correspondence relationship with the angle θ. In the present embodiment, the detected value θs is the value of the angle θ detected by the magnetic sensor 1. The arithmetic circuit 30 can be implemented by a microcomputer, for example. How to compute the detected value θs will be described in detail later.

The first detection circuit 10 has a Wheatstone bridge circuit 14 and a difference circuit 15. The Wheatstone bridge circuit 14 includes a power supply port V1, a ground port G1, two output ports E11 and E12, a first pair of magnetic detection elements R11 and R12 connected in series, and a second pair of magnetic detection elements R13 and R14 connected in series. One end of each of the magnetic detection elements R11 and R13 is connected to the power supply port V1. The other end of the magnetic detection element R11 is connected to one end of the magnetic detection element R12 and the output port E11. The other end of the magnetic detection element R13 is connected to one end of the magnetic detection element R14 and the output port E12. The other end of each of the magnetic detection elements R12 and R14 is connected to the ground port G1. A power supply voltage of predetermined magnitude is applied to the power supply port V1. The ground port G1 is grounded. The difference circuit 15 outputs to the arithmetic circuit 30 a signal corresponding to the potential difference between the output ports E11 and E12 as the first signal S1.

The second detection circuit 20 has a circuit configuration similar to that of the first detection circuit 10. More specifically, the second detection circuit 20 has a Wheatstone bridge circuit 24 and a difference circuit 25. The Wheatstone bridge circuit 24 includes a power supply port V2, a ground port G2, two output ports E21 and E22, a first pair of magnetic detection elements R21 and R22 connected in series, and a second pair of magnetic detection elements R23 and R24 connected in series. One end of each of the magnetic detection elements R21 and R23 is connected to the power supply port V2. The other end of the magnetic detection element R21 is connected to one end of the magnetic detection element R22 and the output port E21. The other end of the magnetic detection element R23 is connected to one end of the magnetic detection element R24 and the output port E22. The other end of each of the magnetic detection elements R22 and R24 is connected to the ground port G2. A power supply voltage of predetermined magnitude is applied to the power supply port V2. The ground port G2 is grounded. The difference circuit 25 outputs to the arithmetic circuit 30 a signal corresponding to the potential difference between the output ports E21 and E22 as the second signal S2.

In the present embodiment, all the magnetic detection elements included in the Wheatstone bridge circuits (hereinafter, referred to as bridge circuits) 14 and 24 are spin-valve MR elements, more specifically, TMR elements. GMR elements may be employed instead of the TMR elements. The TMR elements or GMR elements each have a magnetization pinned layer whose magnetization direction is pinned, a free layer which is a magnetic layer whose magnetization direction varies according to the direction DM of the target magnetic field MF, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. The TMR elements or GMR elements vary in resistance depending on the angle that the magnetization direction of the free layer forms with respect to the magnetization direction of the magnetization pinned layer. The resistance reaches its minimum value when the foregoing angle is 0°. The resistance reaches its maximum value when the foregoing angle is 180°. In the following description, the magnetic detection elements included in the bridge circuits 14 and 24 will be referred to as MR elements. In FIG. 4, the filled arrows indicate the magnetization directions of the magnetization pinned layers of the MR elements. The hollow arrows indicate the magnetization directions of the free layers of the MR elements.

In the first detection circuit 10, the magnetization pinned layers of the MR elements R11 and R14 are magnetized in the X direction, and the magnetization pinned layers of the MR elements R12 and R13 are magnetized in the −X direction. In FIG. 2, the arrow DP1 indicates the magnetization direction of the magnetization pinned layers of the MR elements R11 and R14. In this case, the potential difference between the output ports E11 and E12 varies according to the strength of the X-direction component of the target magnetic field MF. The first detection circuit 10 thus detects the strength of the X-direction component of the target magnetic field MF and generates the first signal S1 indicating the strength.

In the second detection circuit 20, the magnetization pinned layers of the MR elements R21 and R24 are magnetized in the Y direction, and the magnetization pinned layers of the MR elements R22 and R23 are magnetized in the −Y direction. In FIG. 2, the arrow DP2 indicates the magnetization direction of the magnetization pinned layers of the MR elements R21 and R24. In this case, the potential difference between the output ports E21 and E22 varies according to the strength of the Y-direction component of the target magnetic field MF. The second detection circuit 20 thus detects the strength of the Y-direction component of the target magnetic field MF and generates the second signal S2 indicating the strength.

In consideration of the production accuracy of the MR elements and other factors, the magnetization pinned layers of the plurality of MR elements in the detection circuits 10 and 20 may be magnetized in directions that are slightly different from the above-described directions.

Each of the plurality of MR elements in the detection circuits 10 and 20 includes a free layer, which is a magnetic layer whose magnetization direction varies according to the direction of the target magnetic field MF in the reference position PR. In the present embodiment, an induced magnetic anisotropy is imparted in advance to the free layer. Hereinafter, the induced magnetic anisotropy imparted in advance to the free layer will be referred to as the preset induced magnetic anisotropy. In each of FIG. 2 and FIG. 3 the arrow DA1 indicates the direction of an easy axis of magnetization resulting from the preset induced magnetic anisotropy. The preset induced magnetic anisotropy can be created by, for example, depositing the free layer while applying a magnetic field thereto in the easy axis direction DA1. Here, the angle that the easy axis direction DA1 forms with respect to the first direction D1 will be designated by symbol $\alpha$. The angle $\alpha$ is preferably in the range of 0° to 15°, and more preferably in the range of 0° to 9°. The reason for this will be described in detail later. Note that the angle $\alpha$ will be expressed as 0° or in a positive value. Cases where the direction DA1 forms the angle $\alpha$ with respect to the direction D1 include a case where the direction DA1 is the direction that is rotated clockwise by $\alpha$ from the direction D1 and a case where the direction DA1 is the direction that is rotated counterclockwise by $\alpha$ from the direction D1.

The waveforms of the first and second signals S1 and S2 ideally trace a sinusoidal curve (including a sine waveform and a cosine waveform). However, in the present embodiment, since the free layer of each MR element has the preset induced magnetic anisotropy, the waveforms of the first and second signals S1 and S2 are distorted from a sinusoidal curve, so that an error occurs in the detected value $\theta$s if no measures are taken.

The magnetic sensor 1 according to the present embodiment makes a correction of the error occurring in the detected value $\theta$s due to the preset induced magnetic anisotropy. In the present embodiment, the correction of the error is implemented by a shape magnetic anisotropy imparted to the free layer. This will be described below with reference to FIG. 2 and FIG. 3. In FIG. 2 and FIG. 3, reference numerals 11 and 21 indicate the planar shapes of the free layers of the MR elements in the detection circuits 10 and 20, respectively. Note that the planar shape refers to the shape in a plan view. In the present embodiment, a shape magnetic anisotropy is imparted to each free layer by, for example, making the free layer elliptical in planar shape, as shown in FIG. 2 and FIG. 3. In each of FIG. 2 and FIG. 3 the arrow DA2 indicates the direction of an easy axis of magnetization resulting from the shape magnetic anisotropy, i.e., the direction of the major axis of the ellipse or the planar shape of the free layer. Note that the planar shape of the free layer is not limited to an elliptical shape, and may be any shape that can impart a shape magnetic anisotropy to the free layer. Examples of such a planar shape of the free layer include a rectangular shape and a rhombic shape, in addition to an elliptical shape.

The angle that the direction DA2 of the easy axis of magnetization resulting from the shape magnetic anisotropy forms with respect to the direction DA1 of the easy axis of magnetization resulting from the preset induced magnetic anisotropy will be designated by symbol 13. The angle that the easy axis direction DA2 forms with respect to the first direction D1 will be designated by symbol $\gamma$. Both the angles $\beta$ and $\gamma$ are preferably in the range of 75° to 90° and more preferably in the range of 81° to 90°. The reason for this will be described in detail later. Cases where $\beta$ is other than 90° include a case where the easy axis direction DA2 forms an angle smaller than 90° with respect to the easy axis direction DA1 and a case where the easy axis direction DA2 forms an angle greater than 90° with respect to the easy axis direction DA1. Where $\beta$ is other than 90°, the former case, i.e., an angle smaller than 90°, shall be taken as $\beta$. Likewise, cases where $\gamma$ is other than 90° include a case where the easy axis direction DA2 forms an angle smaller than 90° with respect to the first direction D1 and a case where the easy axis direction DA2 forms an angle greater than 90° with respect to the first direction D1. Where $\gamma$ is other than 90°, the former case, i.e., an angle smaller than 90°, shall be taken as $\gamma$. FIG. 2 shows an example where $\alpha$ is other than 0° while $\beta$ is other than 90°, $\gamma$ being 90°. FIG. 3 shows an example where $\alpha$ is 0° while $\beta$ and $\gamma$ are other than 90°. Note that it is ideal that $\alpha$ be 0° while $\beta$ and $\gamma$ be 90°.

Figure 5:
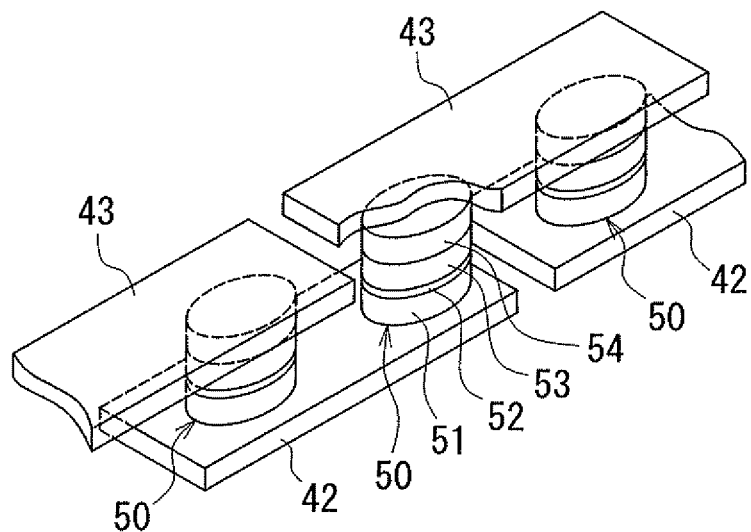
FIG. 5 is a perspective view illustrating part of an MR element shown in FIG. 4.

Now, an example of the configuration of each MR element and the shape magnetic anisotropy imparted to the free layer will be described with reference to FIG. 2, FIG. 3 and FIG. 5. FIG. 5 is a perspective view illustrating part of an MR element shown in FIG. 4. In this example, the MR element has a plurality of lower electrodes 42, a plurality of MR films 50, and a plurality of upper electrodes 43. The plurality of lower electrodes 42 are disposed on a substrate (not shown). Each of the lower electrodes 42 has a long slender shape. Every two lower electrodes 42 that adjoin in the longitudinal direction of the lower electrodes 42 have a gap therebetween. As shown in FIG. 5, MR films 50 are provided on the top surfaces of the lower electrodes 42, near opposite ends in the longitudinal direction.

Each of the MR films 50 includes a free layer 51, a nonmagnetic layer 52, a magnetization pinned layer 53, and an antiferromagnetic layer 54 that are stacked in this order, the free layer 51 being closest to the lower electrode 42. In the example shown in FIG. 5, each of the MR films 50 is elliptical cylinder-shaped. In this case, the planar shape of the free layer 51 is elliptical. The free layer 51 is electrically connected to the lower electrode 42. The antiferromagnetic layer 54 is made of an antiferromagnetic material. The antiferromagnetic layer 54 is in exchange coupling with the magnetization pinned layer 53 so as to pin the magnetization direction of the magnetization pinned layer 53. The plurality of upper electrodes 43 are arranged over the plurality of MR films 50. Each of the upper electrodes 43 has a long slender shape, and establishes electrical connection between the respective antiferromagnetic layers 54 of two adjoining MR films 50 that are arranged on two lower electrodes 42 adjoining in the longitudinal direction of the lower electrodes 42. With such a configuration, the plurality of MR films 50 in the MR element shown in FIG. 5 are connected in series by the plurality of lower electrodes 42 and the plurality of upper electrodes 43. It should be appreciated that the layers 51 to 54 of the MR films 50 may be stacked in an order reverse to that shown in FIG. 5.

In the present embodiment, a shape magnetic anisotropy is imparted to the free layer 51 by making the planar shape of the free layer 51 elliptical. The direction of the major axis of the ellipse or the planar shape of the free layer 51 is the direction DA2 of the easy axis of magnetization resulting from the shape magnetic anisotropy, which is shown in FIG. 2 and FIG. 3.

Note that the shape of the MR films 50 is not limited to the example shown in FIG. 5. For example, the MR films 50 may have a prismatic shape with a rectangular or rhombic top surface.

How to compute the detected value $\theta$s will now be described with reference to FIG. 4. In the example shown in FIG. 4, the magnetization directions of the magnetization pinned layers of the MR elements in the second detection circuit 20 are ideally orthogonal to the magnetization directions of the magnetization pinned layers of the MR elements in the first detection circuit 10. In this case, the first signal S1 ideally has a cosine waveform that depends on the angle $\theta$, and the second signal S2 ideally has a sine waveform that depends on the angle $\theta$. In this case, the second signal S2 differs from the first signal S1 in phase by ¼ the signal period T, i.e., by $\pi/2$ (90°).

When the angle $\theta$ is equal to or greater than 0° and smaller than 90° and when the angle $\theta$ is greater than 270° and smaller than or equal to 360°, the first signal S1 takes on a positive value. When the angle θ is greater than 90° and smaller than 270°, the first signal S1 takes on a negative value. Further, when the angle θ is greater than 0° and smaller than 180°, the second signal S2 takes on a positive value. When the angle θ is greater than 180° and smaller than 360°, the second signal S2 takes on a negative value.

Based on the first and second signals S1 and S2, the arithmetic circuit 30 computes the detected value θs having a correspondence relationship with the angle θ. Specifically, the arithmetic circuit 30 computes θs by using the following Equation (1), for example. Note that "a tan" represents an arctangent.

$$\theta s = a\tan(S2/S1) \quad (1)$$

The term "a tan (S2/S1)" of Equation (1) represents the arctangent calculation for determining θs. For θs in the range of 0° or greater and smaller than 360°, there are two solutions of θs in Equation (1) with a difference of 180° in value. Which of the two solutions of θs in Equation (1) is the true solution to θs can be determined from the combination of positive and negative signs on S1 and S2. More specifically, if S1 is positive in value, θs is equal to or greater than 0° and smaller than 90°, or is greater than 270° and smaller than or equal to 360°. If S1 is negative in value, θs is greater than 90° and smaller than 270°. If S2 is positive in value, θs is greater than 0° and smaller than 180°. If S2 is negative in value, θs is greater than 180° and smaller than 360°. Using Equation (1) and based on the foregoing determination of the combination of positive and negative signs on S1 and S2, the arithmetic circuit 30 determines θs within the range of 0° or greater and smaller than 360°.

The operation and effects of the magnetic sensor system according to the present embodiment will now be described. When the magnetic sensor system is in the non-operating state, the direction DM of the target magnetic field MF in the reference position PR does not vary when viewed from the magnetic sensor 1. Meanwhile, the target magnetic field MF oriented in a certain direction is continuously applied to the magnetic sensor 1, and the magnetization direction of the free layer 51 of each of the plurality of MR elements in the detection circuits 10 and 20 is pinned in the first direction D1.

Here, consider a case where the free layer 51 does not have the preset induced magnetic anisotropy. In this case, there is a possibility that an induced magnetic anisotropy to orient the easy axis of magnetization in a direction parallel to the first direction D1 may occur in the free layer 51 on an a posteriori basis due to the target magnetic field MF which is continuously applied to the magnetic sensor 1 when the magnetic sensor system is in the non-operating state. Such an induced magnetic anisotropy will hereinafter be referred to as an a posteriori induced magnetic anisotropy. The a posteriori induced magnetic anisotropy occurs, for example, when the temperature of the MR element is lowered from a high temperature during the non-operating state. The occurrence of the a posteriori induced magnetic anisotropy in the free layer 51 causes the waveforms of the first and second signals S1 and S2 to be distorted from a sinusoidal curve, thus causing an error in the detected value θs. Hereinafter, any situation that induces an a posteriori induced magnetic anisotropy in the free layer 51 will be referred to as the anisotropy inducing situation. Further, the error in the detected value θs will be referred to as an angle error. The magnitude of the a posteriori induced magnetic anisotropy (the magnitude of the anisotropy field) occurring in the free layer 51 will continue to increase until it is saturated as the cumulative time of the anisotropy inducing situation increases. Accordingly, the angle error will also continue to increase.

Figure 6:
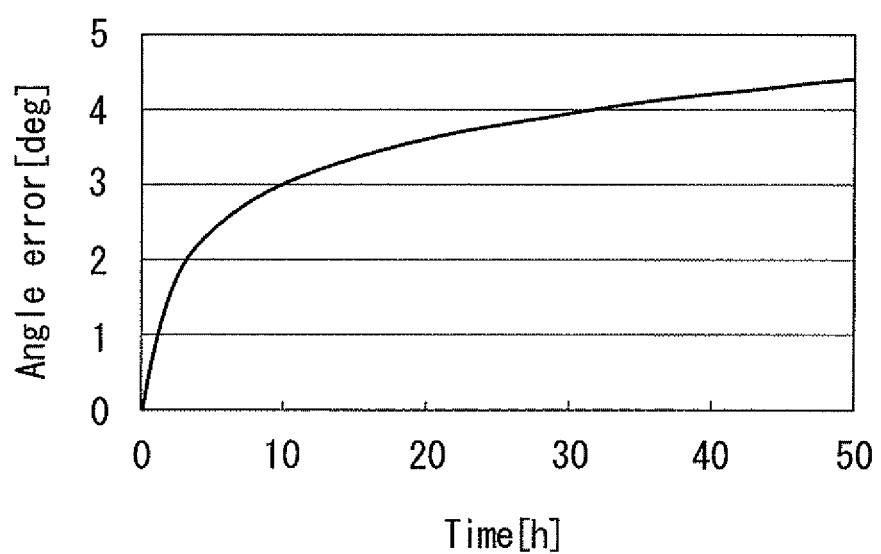
FIG. 6 is a characteristic diagram illustrating an example of the relationship between the cumulative time of an anisotropy inducing situation and the angle error.

FIG. 6 is a characteristic diagram illustrating an example of the relationship between the cumulative time of the anisotropy inducing situation and the angle error. In FIG. 6, the horizontal axis represents the cumulative time of the anisotropy inducing situation, and the vertical axis represents the angle error. As shown in FIG. 6, the longer the cumulative time of the anisotropy inducing situation, the greater the angle error becomes. However, as the cumulative time of the anisotropy inducing situation increases, the amount of increase in the angle error per unit time decreases. As the cumulative time of the anisotropy inducing situation increases beyond the maximum value of time shown on the horizontal axis of FIG. 6, the magnitude of the induced magnetic anisotropy will be saturated after a while, and the angle error will also be saturated.

In the present embodiment, the free layer 51 has the preset induced magnetic anisotropy. The direction DA1 of the easy axis of magnetization resulting from the preset induced magnetic anisotropy is parallel or nearly parallel to the first direction D1. More specifically, as described previously, the angle α that the direction DA1 of the easy axis of magnetization resulting from the preset induced magnetic anisotropy forms with respect to the first direction D1 is preferably in the range of 0° to 15°, and more preferably in the range of 0° to 9°.

By imparting the preset induced magnetic anisotropy to the free layer 51 as described above, an induced magnetic anisotropy that may occur in the free layer 51 due to an a posteriori factor is less increased in magnitude after the start of use of the magnetic sensor system when compared with a case where no preset induced magnetic anisotropy is imparted to the free layer 51. If the preset induced magnetic anisotropy is imparted so as to saturate the magnitude of the induced magnetic anisotropy in the free layer 51, the magnitude of the induced magnetic anisotropy in the free layer 51 will not increase after the start of use of the magnetic sensor system. From the viewpoint of the angle error, the fact that the preset induced magnetic anisotropy is imparted to the free layer 51 is equivalent to the fact that the cumulative time of the anisotropy inducing situation on the horizontal axis shown in FIG. 6 has already elapsed to some extent at the start of use of the magnetic sensor system. According to the present embodiment, this allows the total amount of increase in the angle error and the amount of increase in the angle error per unit time after the start of use of the magnetic sensor system to be smaller than in the case where no preset induced magnetic anisotropy is imparted to the free layer 51.

Note that the preset induced magnetic anisotropy imparted to the free layer 51 would cause an angle error at the start of use of the magnetic sensor system if no measures are taken. However, such an angle error occurring at the start of use can be known in advance. It is thus possible to correct the angle error in advance so as to reduce the angle error. In the present embodiment, the correction of the angle error is implemented by the shape magnetic anisotropy imparted to the free layer 51. Consequently, according to the present embodiment, it is possible to reduce the angle error caused by an induced magnetic anisotropy occurring on an a posteriori basis in the free layer 51.

Now, a detailed description will be given of the fact that imparting the shape magnetic anisotropy to the free layer 51 allows the correction of an angle error resulting from the preset induced magnetic anisotropy. If the preset induced magnetic anisotropy is imparted to the free layer 51 without imparting the shape magnetic anisotropy to the free layer 51, the preset induced magnetic anisotropy causes the first and second signals S1 and S2 to have a first error that is dependent on the angle θ. On the other hand, if the shape magnetic anisotropy is imparted to the free layer 51 without imparting the preset induced magnetic anisotropy to the free layer 51, the shape magnetic anisotropy causes the first and second signals S1 and S2 to have a second error that is dependent on the angle θ. The main component of the first and the second errors is a component that has a period of ½ the signal period T. This component will hereinafter be referred to as the second-order component.

In the present embodiment, the shape magnetic anisotropy as well as the preset induced magnetic anisotropy is imparted to the free layer 51. The angle β that the direction DA2 of the easy axis of magnetization resulting from the shape magnetic anisotropy forms with respect to the direction DA1 of the easy axis of magnetization resulting from the preset induced magnetic anisotropy is 90° or close to 90°. More specifically, as described previously, the angle β is preferably in the range of 75° to 90°, and more preferably in the range of 81° to 90°. This causes the second-order component of the first error and that of the second error to have opposite or nearly opposite phases. As a result, the second-order component of the first error and that of the second error cancel out each other. This reduces the second-order component of an error remaining in the first and second signals S1 and S2 (hereafter referred to as the residual error), and consequently reduces the angle error.

Figure 7:
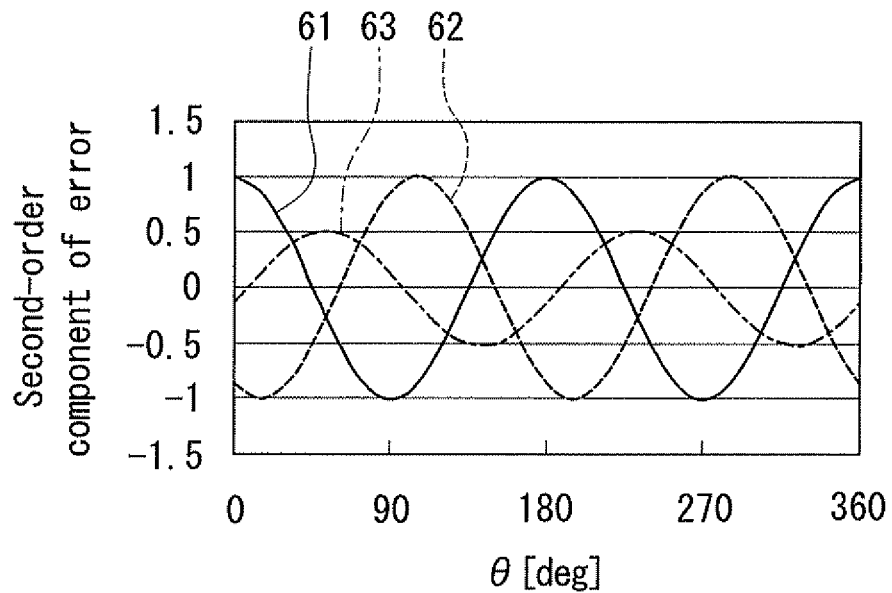
FIG. 7 is a waveform diagram illustrating the waveform of a second-order component of each of a first error, a second error and a residual error determined by simulation.

Now, referring to the results of simulations, a further description will be given of the fact that the second-order component of the residual error is reduced as described above. FIG. 7 is a waveform diagram illustrating the waveform of the second-order component of each of the first error, the second error and the residual error determined by simulation. In FIG. 7, the horizontal axis represents the angle θ and the vertical axis represents the magnitude of the second-order component. In FIG. 7, reference numeral 61 indicates the waveform of the second-order component of the first error, reference numeral 62 indicates the waveform of the second-order component of the second error, and reference numeral 63 indicates the waveform of the second-order component of the residual error. FIG. 7 illustrates an example in which the second-order component of the first error and that of the second error have the same amplitude and the angle β is 75°. The vertical axis of FIG. 7 represents relative values assuming the maximum value of the second-order components of the first and second errors as 1.

In the example shown in FIG. 7, the amplitude of the second-order component of the residual error (reference numeral 63) is 50% of the amplitude of the second-order component of the first error (reference numeral 61). It is obvious that when the angle β is greater than 75° and smaller than or equal to 90°, the amplitude of the second-order component of the residual error is less than 50% of the amplitude of the second-order component of the first error. The angle β is preferably in the range of 75° to 90° because this allows the amplitude of the second-order component of the residual error to be 50% or less of the amplitude of the second-order component of the first error resulting from the preset induced magnetic anisotropy.

Further, although not illustrated, making the angle β fall within the range of 81° to 90° allows the amplitude of the second-order component of the residual error to be 30% or less of the amplitude of the second-order component of the first error. From this viewpoint, it is more preferred that the angle β be in the range of 81° to 90°.

Now, a description will be given of a preferable range of the angle α (see FIG. 2) that the direction DA1 of the easy axis of magnetization resulting from the preset induced magnetic anisotropy forms with respect to the first direction D1. If the angle α is 0° and the preset induced magnetic anisotropy is imparted so as to saturate the magnitude of an induced magnetic anisotropy in the free layer 51, the magnitude of the induced magnetic anisotropy in the free layer 51 will not increase after the start of use of the magnetic sensor system. If the angle α is other than 0°, however, an a posteriori induced magnetic anisotropy that orients the easy axis of magnetization in a direction parallel to the first direction D1 may occur in the free layer 51. This will cause the free layer 51 to have an induced magnetic anisotropy that results from a combination of the preset induced magnetic anisotropy and the a posteriori induced magnetic anisotropy. Such an induced magnetic anisotropy orients the easy axis of magnetization in a direction deviating from the direction DA1 of the easy axis of magnetization provided by the preset induced magnetic anisotropy. This means that if the angle β is set at 90° at the start of use of the magnetic sensor system, the angle β will deviate from 90° after the start of use of the magnetic sensor system. However, where the angle α is other than 0°, the amount of deviation of the easy axis direction caused by the a posteriori induced magnetic anisotropy has a maximum value of α. Therefore, if the angle α falls within the range of 0° to 15°, an effect equivalent to or higher than that provided in the case where the angle β falls within the range of 75° to 90° is obtainable, and if the angle α falls within the range of 0° to 9°, an effect equivalent to or higher than that provided in the case where the angle β falls within the range of 81° to 90° is obtainable. Thus, the angle α preferably falls within the range of 0° to 15°, and more preferably within the range of 0° to 9°.

However, if the angle γ is smaller than 75° even with the angle α within the range of 0° to 15° and the angle β within the range of 75° to 90°, there is a possibility that the direction of the easy axis of magnetization resulting from the aforementioned induced magnetic anisotropy, i.e., the combination of the preset induced magnetic anisotropy and the a posteriori induced magnetic anisotropy, in the free layer 51 may form an angle smaller than 75° with respect to the easy axis direction DA2. In that case, the amplitude of the second-order component of the residual error may exceed 50% of the amplitude of the second-order component of the first error. From this viewpoint, it is preferred that the angle γ, as well as the angle β, fall within the range of 75° to 90°, and more preferably within the range of 81° to 90°.

On the other hand, the first error caused by the preset induced magnetic anisotropy may contain not only the second-order component but also a component having a period of ⅓ the signal period T, which will hereinafter be referred to as the third-order component. Likewise, the second error caused by the shape magnetic anisotropy may contain the third-order component in addition to the second-order component. The magnitude of the third-order component in the second error can be adjusted by the shape of the free layer 51. Thus, when the first error contains the third-order component, adjustment by the shape of the free layer 51 allows a reduction of the third-order component of the residual error. This will be described in more detail below.

For example, if the planar shape of the free layer 51 is elliptical, varying the ratio of the length of the minor axis of the ellipse to the length of the major axis of the ellipse causes a change in the magnitude of the third-order component of the second error. Here, it is assumed that one of the minor axis and the major axis of the ellipse or the planar shape of the free layer 51 is parallel to the X direction and the other is parallel to the Y direction. It is also assumed that the direction DA1 of the easy axis of magnetization resulting from the preset induced magnetic anisotropy imparted to the free layer 51 is parallel to the Y direction. Further, the ratio of the length of the ellipse in the X direction to the length of the ellipse in the Y direction will be referred to as the aspect ratio. Where the aspect ratio is greater than 1, the direction of the major axis of the ellipse and the direction DA2 of the easy axis of magnetization resulting from the shape magnetic anisotropy are parallel to the X direction. In this case, the phase of the third-order component of the second error is opposite to the phase of the third-order component of the first error. Where the aspect ratio is smaller than 1, the direction of the major axis of the ellipse and the easy axis direction DA2 are parallel to the Y direction. In this case, the phase of the third-order component of the second error is the same as the phase of the third-order component of the first error. Where the aspect ratio is 1, the planar shape of the free layer 51 is circular, causing no shape magnetic anisotropy in the free layer 51.

Figure 8:
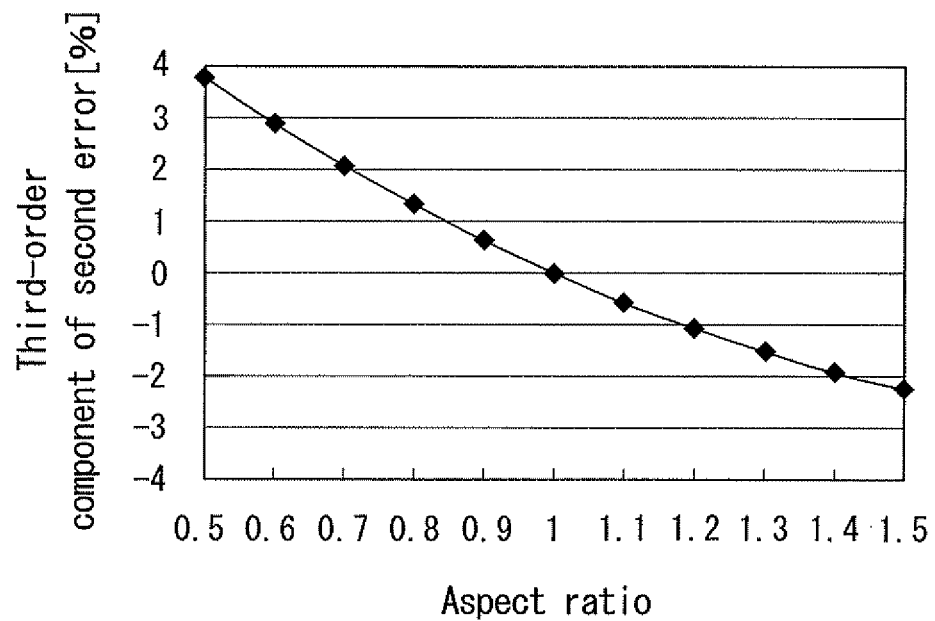
FIG. 8 is a characteristic diagram illustrating an example of the relationship between the aspect ratio and the magnitude of a third-order component of the second error determined by simulation.

FIG. 8 is a characteristic diagram illustrating an example of the relationship, determined by simulation, between the aspect ratio and the magnitude of the third-order component of the second error. In FIG. 8, the horizontal axis represents the aspect ratio while the vertical axis represents the magnitude of the third-order component of the second error. Note that in FIG. 8 the magnitude of the third-order component is represented by the ratio of the amplitude (maximum value) of the third-order component of the second error to the amplitude (maximum value) of an ideal component or an ideal sinusoidal curve component of the first and second signals S1 and S2 expressed as a percentage. Further, the magnitude of the third-order component is expressed to take on a positive value when the aspect ratio is smaller than 1 and take on a negative value when the aspect ratio is greater than 1.

For example, when the amplitude (maximum value) of the third-order component of the first error is about 1% of the amplitude (maximum value) of the ideal component, making the magnitude of the third-order component of the second error about −1% allows the third-order components of the first and second errors to cancel out each other to thereby reduce the third-order component of the residual error. In the example shown in FIG. 8, this can be achieved by making the aspect ratio fall within the range of about 1.1 to about 1.3. Thus, the present embodiment makes it possible to reduce the third-order component of the residual error by adjusting the elliptical shape of the free layer 51, thereby allowing a further reduction in the angle error.

[Second Embodiment]

Figure 9:
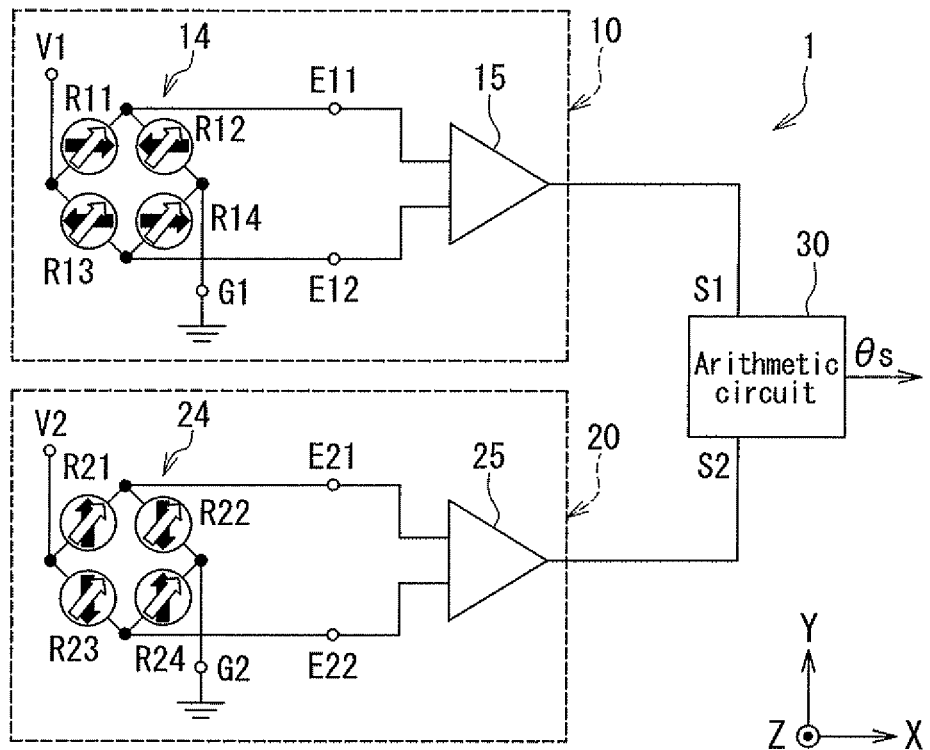
FIG. 9 is a circuit diagram illustrating the configuration of a magnetic sensor of a second embodiment of the invention.
Figure 10:
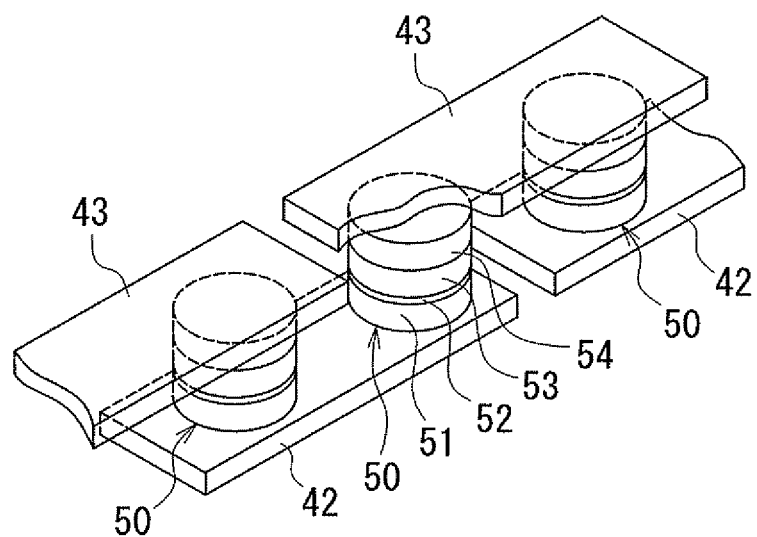
FIG. 10 is a perspective view illustrating part of an MR element shown in FIG. 9.

A second embodiment of the present invention will now be described with reference to FIG. 9 and FIG. 10. FIG. 9 is a circuit diagram illustrating the configuration of the magnetic sensor 1 of the present embodiment. FIG. 10 is a perspective view illustrating part of an MR element shown in FIG. 9. In the present embodiment, the free layer 51, which is a magnetic layer whose magnetization direction varies according to the direction of the target magnetic field MF in the reference position PR, has no shape magnetic anisotropy. In the example shown in FIG. 10, the MR films 50 are circular cylindrical-shaped. In this case, the planar shape of the free layer 51 is circular.

In the magnetic sensor 1 of the present embodiment, an error occurring in the detected value θs due to the preset induced magnetic anisotropy imparted to the free layer 51 is corrected by the arithmetic circuit 30. The arithmetic circuit 30 computes a corrected detected value θs in the following manner from the first and second signals S1 and S2 generated by the first and second detection circuits 10 and 20.

The arithmetic circuit 30 computes an uncorrected θs from the first and second signals S1 and S2 by Equation (1) given in the first embodiment section. The uncorrected θs contains an angle error resulting from the preset induced magnetic anisotropy. The arithmetic circuit 30 of the present embodiment holds a table that indicates the correspondence relationship of a plurality of values of the uncorrected θs with a plurality of values of the corrected θs that are theoretically determined assuming that no preset induced magnetic anisotropy is imparted. Referring to this table, the arithmetic circuit 30 determines the corrected θs from the uncorrected θs and then outputs the resulting value as the detected value θs.

The other configuration, operation, and effects of the present embodiment are the same as those of the first embodiment.

[Third Embodiment]

Figure 11:
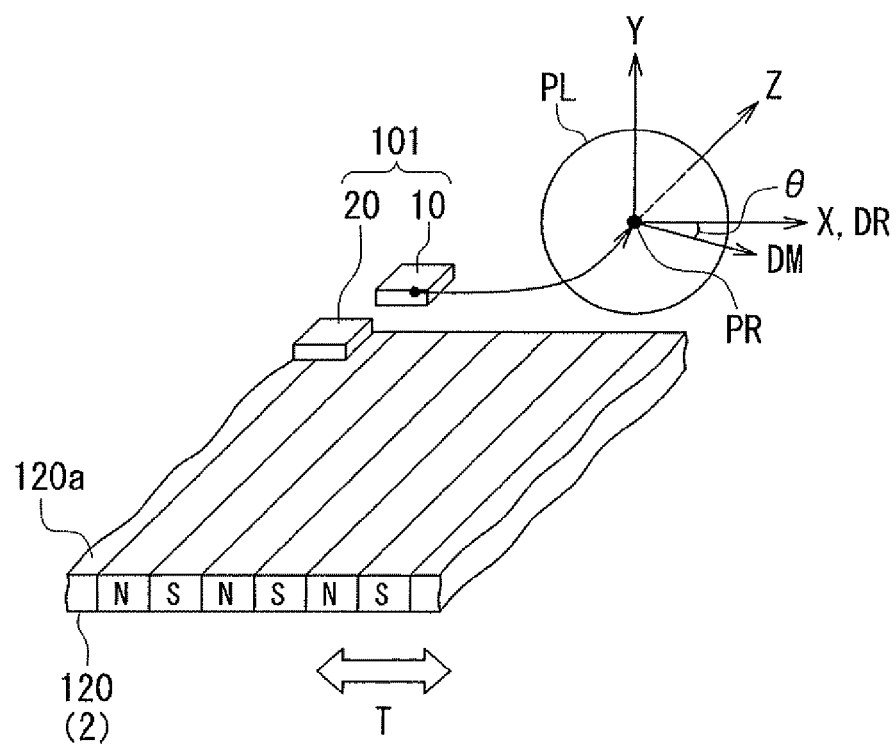
FIG. 11 is a perspective view illustrating the general configuration of a magnetic sensor system according to a third embodiment of the invention.

A third embodiment of the present invention will now be described. First, the general configuration of the magnetic sensor system according to the present embodiment will be described with reference to FIG. 11. FIG. 11 is a perspective view illustrating the general configuration of the magnetic sensor system according to the present embodiment. The magnetic sensor system according to the present embodiment includes a magnetic field generation unit 2 for generating a target magnetic field, and a magnetic sensor 101 for detecting the target magnetic field. The magnetic sensor 101 includes a first detection circuit 10 and a second detection circuit 20 for detecting the target magnetic field. The magnetic field generation unit 2 of the present embodiment has a magnetic scale 120 including a plurality of pairs of N and S poles alternately arranged in a straight line. FIG. 11 shows an example in which the magnetic scale 120 has a top surface 120a that is parallel to the direction T in which the N and S poles of the magnetic scale 120 are aligned. The magnetic sensor 101 is disposed to face the top surface 120a of the magnetic scale 120. In the present embodiment, when the magnetic sensor system is in the operating state, at least one of the magnetic scale 120 and the magnetic sensor 101 moves linearly in the direction T so that the relative positional relationship between the magnetic scale 120 and the magnetic sensor 101 varies in the direction T. When the magnetic sensor system is in the non-operating state, both the magnetic scale 120 and the magnetic sensor 101 are at a standstill so that the relative positional relationship between the magnetic scale 120 and the magnetic sensor 101 is fixed in the direction T.

Here, the length of a pair of neighboring N and S poles of the magnetic scale 120 in the direction T will be referred to as one pitch. The first detection circuit 10 and the second detection circuit 20 are located in positions that are different from each other by ¼ pitch in the direction T.

The first and second detection circuits 10 and 20 include respective magnetic detection elements. The magnetic detection elements of the present embodiment are, for example, TMR elements or GMR elements as with the first embodiment. The magnetic detection elements will hereinafter be referred to as MR elements. In the present embodiment, the detection circuits 10 and 20 are disposed such that the planes of a plurality of layers constituting each MR element (MR film) are parallel to the top surface 120a of the magnetic scale 120.

Figure 12:
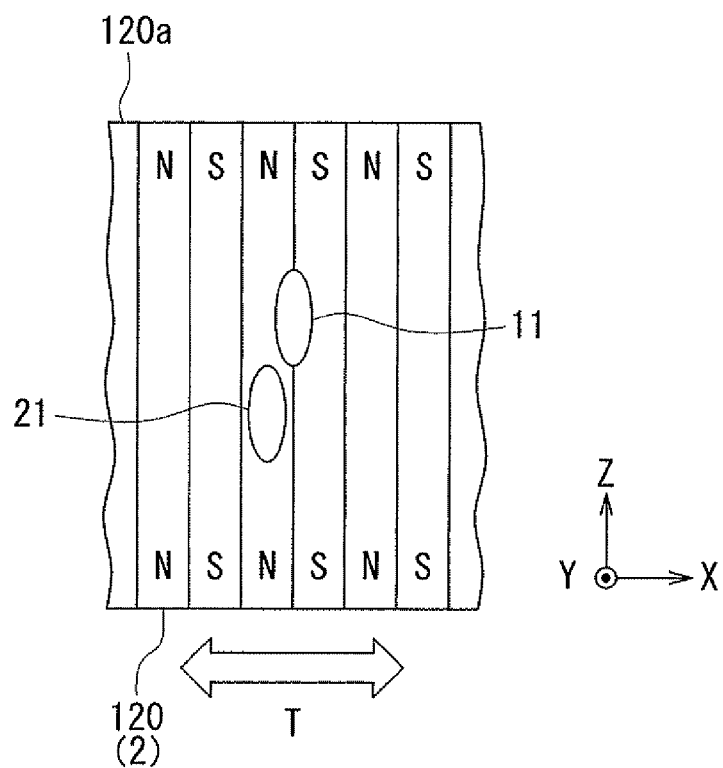
FIG. 12 is an explanatory diagram illustrating the shape and arrangement of MR elements in the third embodiment of the invention.

FIG. 12 schematically illustrates the shape and arrangement of the MR elements. In FIG. 12 the reference numerals 11 and 12 indicate the planar shapes of the free layers of the MR elements in the detection circuits 10 and 20, respectively. The MR element of the second detection circuit 20 is offset from the MR element of the first detection circuit 10 by ¼ pitch in the direction T. The planar shapes of the free layers will be described in detail later.

The reference plane, the reference position, and the reference direction in the present embodiment will now be described with reference to FIG. 11. In the present embodiment, one direction parallel to the direction T is defined as the X direction (the rightward direction in FIG. 11); one direction perpendicular to the top surface 120a of the magnetic scale 120 is defined as the Y direction (the upward direction in FIG. 11); and the direction perpendicular to the X direction and the Y direction is defined as the Z direction (the direction toward the deeper side in FIG. 11). Further, the direction opposite to the X direction is defined as the −X direction.

The reference plane PL in the present embodiment is a plane perpendicular to the Z direction. The reference position PR is located within the reference plane PL. The reference position PR may be the position in which the first detection circuit 10 detects the target magnetic field or the position in which the second detection circuit 20 detects the target magnetic field. The following description assumes that the reference position PR is the position in which the first detection circuit 10 detects the target magnetic field. When the magnetic sensor system is in the operating state, the direction DM of the target magnetic field in the reference position PR varies within the reference plane PL when viewed from the magnetic sensor 1. In the present embodiment, in particular, when the magnetic sensor system is in the operating state, the direction DM of the target magnetic field in the reference position PR rotates about the reference position PR when viewed from the magnetic sensor 1. A change by one pitch in the relative positional relationship between the magnetic scale 120 and the magnetic sensor 1 in the direction T causes the direction DM of the target magnetic field in the reference position PR to rotate by 360°. Thus, the relative positional relationship between the magnetic scale 120 and the magnetic sensor 1 and the direction DM of the target magnetic field in the reference position PR have a correspondence relationship with each other. One pitch is equivalent to a rotational angle of 360° of the direction DM of the target magnetic field. Since the first detection circuit 10 and the second detection circuit 20 are located in positions that are different from each other by ¼ pitch in the direction T as mentioned above, the direction of the target magnetic field in the position in which the second detection circuit 20 detects the target magnetic field is different by 90° from the direction DM of the target magnetic field in the reference position PR.

On the other hand, when the magnetic sensor system is in the non-operating state, the direction DM of the target magnetic field in the reference position PR does not vary within the reference plane PL when viewed from the magnetic sensor 1, and the magnetization direction of the free layer of each of the plurality of MR elements in the detection circuits 10 and 20 is pinned in the first direction D1 with an exception described below. In the present embodiment, the first direction D1 is the direction T (the X direction or the −X direction). The exception is the case where the direction of the target magnetic field applied to the magnetic layer (the free layer) is pinned in the Y direction or the −Y direction in one of the detection circuits 10 and 20. Even in this case, in the other of the detection circuits 10 and 20 the magnetization direction of the free layer is pinned in the first direction D1.

In the present embodiment, the reference direction DR shall be the X direction. The angle that the direction DM of the target magnetic filed in the reference position PR forms with respect to the reference direction DR will be designated by symbol θ. The angle θ will be expressed in a positive value when viewed clockwise from the reference direction DR, and in a negative value when viewed counterclockwise from the reference direction DR.

Figure 13:
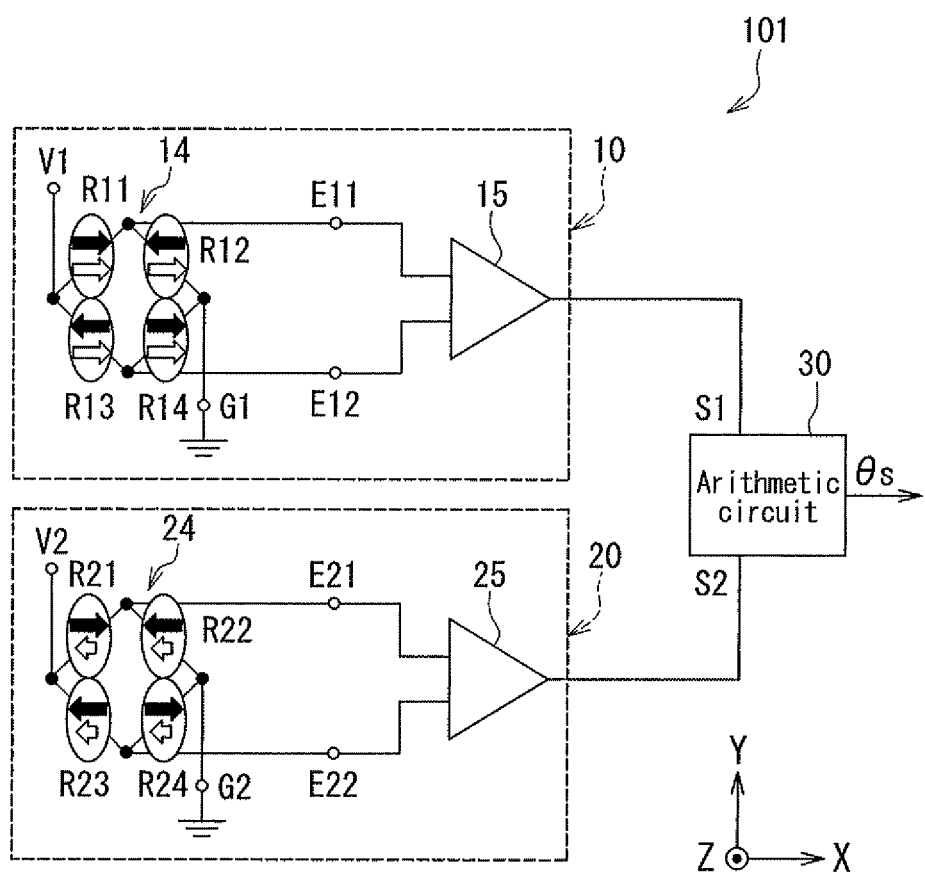
FIG. 13 is a circuit diagram illustrating the configuration of a magnetic sensor of the third embodiment of the invention.

The configuration of the magnetic sensor 101 will now be described in detail with reference to FIG. 13. FIG. 13 is a circuit diagram illustrating the configuration of the magnetic sensor 101. The magnetic sensor 101 includes the aforementioned first and second detection circuits 10 and 20, and an arithmetic circuit 30. The configurations of the detection circuits 10 and 20 are the same as those in the first embodiment except the shape of MR films constituting the MR elements and the magnetization directions of the magnetization pinned layers of the MR elements. The arithmetic circuit 30 has two inputs and an output. The two inputs of the arithmetic circuit 30 are connected to the respective outputs of the detection circuits 10 and 20.

The arithmetic circuit 30 computes a detected value θs having a correspondence relationship with the angle θ. In the present embodiment, the detected value θs is the value of the angle θ detected by the magnetic sensor 101, and is related to the relative positional relationship between the magnetic scale 120 and the magnetic sensor 101 in the direction T. The magnetic sensor system according to the present embodiment is thus capable of detecting the position of the magnetic sensor 101 with respect to the magnetic scale 120 in the direction T.

In FIG. 13, the filled arrows indicate the magnetization directions of the magnetization pinned layers of the MR elements, while the hollow arrows indicate the magnetization directions of the free layers of the MR elements. In the present embodiment, the magnetization pinned layers of the MR elements R11, R14, R21, and R24 are magnetized in the X direction, and the magnetization pinned layers of the MR elements R12, R13, R22, and R23 are magnetized in the −X direction.

In the present embodiment, the first detection circuit 10 detects the strength of a component of the target magnetic field in the direction T (the X direction or the −X direction) in the reference position PR, and outputs to the arithmetic circuit 30 a first signal S1 indicating the strength. The first signal S1 has a correspondence relationship with the angle θ that the direction DM of the target magnetic field in the reference position PR forms with respect to the reference direction DR.

The second detection circuit 20 detects the strength of a component of the target magnetic field in the direction T (the X direction or the −X direction) in the position in which the second detection circuit 20 detects the target magnetic field, and outputs to the arithmetic circuit 30 a second signal S2 indicating the strength. As previously mentioned, the direction of the target magnetic field in the position in which the second detection circuit 20 detects the target magnetic field has a certain relationship with the direction DM of the target magnetic field in the reference position PR, i.e., a difference by 90°. Thus, the second signal S2 also has a correspondence relationship with the angle θ that the direction DM of the target magnetic field in the reference position PR forms with respect to the reference direction DR.

The second signal S2 differs from the first signal S1 in phase. In the present embodiment, the second signal S2 differs from the first signal S1 in phase by 90°, in particular. The first signal S1 ideally has a cosine waveform that depends on the angle θ, and the second signal S2 ideally has a sine waveform that depends on the angle θ. The arithmetic circuit 30 computes the detected value θs in the same manner as in the first embodiment.

In the present embodiment, the preset induced magnetic anisotropy is imparted to the free layer of each MR element in the detection circuits 10 and 20. The free layer is a magnetic layer whose magnetization direction varies according to the direction of the target magnetic field. As in the first embodiment, the angle α that the direction DA1 of the easy axis of magnetization resulting from the preset induced magnetic anisotropy forms with respect to the first direction D1 (the direction T) is preferably in the range of 0° to 15° and more preferably in the range of 0° to 9°. According to the present embodiment, as with the first embodiment, this allows the total amount of increase in the angle error and the amount of increase in the angle error per unit time after the start of use of the magnetic sensor system to be smaller than in the case where no preset induced magnetic anisotropy is imparted to the free layer.

Furthermore, in the present embodiment, as in the first embodiment, the angle error resulting from the preset induced magnetic anisotropy is corrected by a shape magnetic anisotropy imparted to the free layer. That is, in the present embodiment, the MR films of the MR elements in the detection circuits 10 and 20 are all formed in the shape of an elliptic cylinder, so that the planar shape (reference numeral 11) of the free layer of each of the plurality of MR elements in the detection circuit 10 and the planar shape (reference numeral 21) of the free layer of each of the plurality of MR elements in the detection circuit 20 are both elliptical. The direction of the major axis of the ellipse or the planar shape of the free layer is the direction DA2 of the easy axis of magnetization resulting from the shape magnetic anisotropy. As in the first embodiment, the angle β that the easy axis direction DA2 forms with respect to the direction DA1 of the easy axis of magnetization resulting from the preset induced magnetic anisotropy and the angle γ that the easy axis direction DA2 forms with respect to the first direction D1 are both preferably in the range of 75° to 90°, and more preferably in the range of 81° to 90°.

From the foregoing, like the first embodiment, the present embodiment is capable of reducing an angle error that is caused by an induced magnetic anisotropy occurring on an a posteriori basis in the free layer.

Note that in the present embodiment, the error occurring in the detected value θs due to the preset induced magnetic anisotropy imparted to the free layer may be corrected by the arithmetic circuit 30, as in the second embodiment.

In the present embodiment, the detection circuits 10 and 20 may be disposed so that a direction perpendicular to the planes of the plurality of layers constituting the MR elements (MR films) intersects the XY plane. In this case, when the magnetic sensor system is in the operating state, a change in the relative positional relationship between the magnetic scale 120 and the magnetic sensor 101 in the direction T causes the magnetization direction of the free layer to rotate. Thus, in this case, the direction D1 in which the magnetization direction of the free layer is pinned when the magnetic sensor system is in the non-operating state can be any direction located within a plane parallel to the plane of the free layer. Furthermore, in this case, the reference plane PL may be a plane parallel to the planes of the plurality of layers constituting the MR elements. Further, the magnetic sensor 1 of the first embodiment may be used in place of the magnetic sensor 101, and the detection circuits 10 and 20 may be disposed so that a direction perpendicular to the planes of the plurality of layers constituting the MR elements intersects the XY plane. In this case, as in the first embodiment, it is possible to make the second signal S2 differ from the first signal S1 in phase by ¼ the signal period T, i.e., by π/2 (90°) while the detection circuits 10 and 20 are disposed in the same position.

The other configuration, operation, and effects of the present embodiment are the same as those of the first or second embodiment.

[Fourth Embodiment]

A fourth embodiment of the present invention will now be described with reference to FIG. 14A and FIG. 14B. FIG. 14A is a circuit diagram illustrating the configuration of a magnetic sensor of a comparative example against the fourth embodiment of the invention. FIG. 14B is a circuit diagram illustrating the configuration of a magnetic sensor of the fourth embodiment of the invention. The magnetic sensor of the comparative example and the magnetic sensor of the present embodiment both include first and second detection circuits 10 and 20. Each of the first and second detection circuits 10 and 20 includes magnetic detection elements. In the present embodiment, all the magnetic detection elements included in the first and second detection circuits 10 and 20 are TMR elements or GMR elements. The magnetic detection elements will hereinafter be referred to as MR elements.

Each of the first and second detection circuits 10 and 20 has a half-bridge circuit in place of the Wheatstone bridge circuit described in the first embodiment section, and has no difference circuit. The first detection circuit 10 has a pair of MR elements R11 and R12 connected in series and provided between a power supply port V1 and a ground port G1, and an output port E1 connected to the connection point between the MR elements R11 and R12. The first signal S1 generated by the first detection circuit 10 is supplied from the output port E1. The second detection circuit 20 has a pair of MR elements R21 and R22 connected in series and provided between the power supply port V1 and a ground port G2, and an output port E2 connected to the connection point between the MR elements R21 and R22. The second signal S2 generated by the second detection circuit 20 is supplied from the output port E2.

Although not illustrated, the magnetic sensor of the comparative example and the magnetic sensor of the present embodiment each include an arithmetic circuit having an input connected to the output ports E1 and E2. The arithmetic circuit computes a detected value θs having a correspondence relationship with the angle θ. The arithmetic circuit computes the detected value θs in the same manner as in the first embodiment.

In FIG. 14A and FIG. 14B, the filled arrows indicate the magnetization directions of the magnetization pinned layers of the MR elements, while the hollow arrows indicate the magnetization directions of the free layers of the MR elements. In the present embodiment, the magnetization pinned layer of the MR element R11 is magnetized in the X direction, and the magnetization pinned layer of the MR element R12 is magnetized in the −X direction. Further, the magnetization pinned layer of the MR element R21 is magnetized in the −Y direction, and the magnetization pinned layer of the MR element R22 is magnetized in the Y direction.

FIG. 14A and FIG. 14B schematically illustrate the planar shapes of the free layers of the MR elements in the detection circuits 10 and 20. The planar shape of the free layer of each of the MR elements R11 and R12 is a rectangle with the longer sides oriented in the Y direction, while the planar shape of the free layer of each of the MR elements R21 and R22 is a rectangle with the longer sides oriented in the X direction. In the magnetic sensor of the comparative example, the rectangles or the planar shapes of the free layers of the MR elements R11, R12, R21 and R22 have the same size. In the magnetic sensor of the present embodiment, the rectangle or the planar shape of the free layer of each of the MR elements R11 and R12 is different from the rectangle or the planar shape of the free layer of each of the MR elements R21 and R22 in size.

In the present embodiment, the first direction D1, which is the direction in which the magnetization direction of the free layer is pinned when the magnetic sensor system is in the non-operating state, shall be the X direction. In the magnetic sensor of the present embodiment, the free layer of each of the MR elements R11, R12, R21 and R22 has the preset induced magnetic anisotropy. As in the first embodiment, the direction of the easy axis of magnetization resulting from the preset induced magnetic anisotropy preferably forms an angle in the range of 0° to 15° and more preferably in the range of 0° to 9° with respect to the first direction D1 (the X direction). According to the present embodiment, as with the first embodiment, this allows the total amount of increase in the angle error and the amount of increase in the angle error per unit time after the start of use of the magnetic sensor system to be smaller than in the case where no preset induced magnetic anisotropy is imparted to the free layer.

For the magnetic sensor of the comparative example, it is assumed that the free layer of each of the MR elements R11, R12, R21 and R22 has the preset induced magnetic anisotropy, as with magnetic sensor of the present embodiment. However, the magnetic sensor of the comparative example is assumed to have an angle error resulting from the preset induced magnetic anisotropy. In the present embodiment, the angle error resulting from the preset induced magnetic anisotropy is corrected by adjusting the magnitude of the shape magnetic anisotropy of the free layer. This will be described in detail below.

First, the planar shape of the free layer of each of the MR elements R11 and R12 of FIG. 14B is a smaller in length in the X direction when compared with the planar shape of the free layer of each of the MR elements R11 and R12 of FIG. 14A. This causes the free layer of each of the MR elements R11 and R12 of FIG. 14B to have a greater anisotropy field resulting from the shape magnetic anisotropy in a direction parallel to the Y direction, when compared with the free layer of each of the MR elements R11 and R12 of FIG. 14A. Consequently, as compared with the detection circuit 10 of FIG. 14A, the detection circuit 10 of FIG. 14B is capable of better reducing the error occurring in the first signal S1 due to the preset induced magnetic anisotropy.

On the other hand, the planar shape of the free layer of each of the MR elements R21 and R22 of FIG. 14B is greater in length in the Y direction when compared with the planar shape of the free layer of each of the MR elements R21 and R22 of FIG. 14A. This causes the free layer of each of the MR elements R21 and R22 of FIG. 14B to have a smaller anisotropy field resulting from the shape magnetic anisotropy in a direction parallel to the X direction, when compared with the free layer of each of the MR elements R21 and R22 of FIG. 14A. Consequently, as compared with the detection circuit 20 of FIG. 14A, the detection circuit 20 of FIG. 14B is capable of better reducing the error occurring in the second signal S2 due to the preset induced magnetic anisotropy.

From the foregoing, as compared with the magnetic sensor of the comparative example, the magnetic sensor of the present embodiment is capable of better reducing the angle error resulting from the preset induced magnetic anisotropy.

The other configuration, operation, and effects of the present embodiment are the same as those of the first embodiment.

[Fifth Embodiment]

A fifth embodiment of the present invention will now be described with reference to FIG. 15A and FIG. 15B. FIG. 15A is a circuit diagram illustrating the configuration of a magnetic sensor of a comparative example against the fifth embodiment of the invention. FIG. 15B is a circuit diagram illustrating the configuration of a magnetic sensor of the fifth embodiment of the invention. The configurations of the magnetic sensor of the comparative example against the present embodiment and the magnetic sensor of the present embodiment are the same as those of the magnetic sensor of the comparative example against the fourth embodiment and the magnetic sensor of the fourth embodiment, respectively. In the present embodiment, however, all the magnetic detection elements included in the first and second detection circuits 10 and 20 are anisotropic magnetoresistive (AMR) elements. The magnetic detection elements will hereinafter be referred to as AMR elements. The AMR elements each include a magnetic layer whose magnetization direction varies according to the direction of a target magnetic field in a reference position. Further, in the AMR elements the magnetic layer varies in resistance according to the angle that the magnetization direction of the magnetic layer forms with respect to the direction of current flowing through the magnetic layer.

In the present embodiment, the first and second signals S1 and S2 vary by two periods while the target magnetic field rotates once. Thus, the signal period of the first and second signals S1 and S2 in the present embodiment is equivalent to a ½ rotation of the target magnetic field, and is ½ the signal period T of the fourth embodiment (the first embodiment).

FIG. 15A and FIG. 15B schematically illustrate the planar shapes of the magnetic layers of the AMR elements in the detection circuits 10 and 20. In both of the magnetic sensor of the comparative example and the magnetic sensor of the present embodiment, the planar shape of the magnetic layer of the AMR element R11 is a rectangle with the longer sides oriented in the Y direction, while the planar shape of the magnetic layer of the AMR element R12 is a rectangle with the longer sides oriented in the X direction.

In the magnetic sensor of the comparative example shown in FIG. 15A, the planar shape of the magnetic layer of the AMR element R21 is a rectangle with the longer sides rotated by 45° counterclockwise from the Y direction, while the planar shape of the magnetic layer of the AMR element R22 is a rectangle with the longer sides rotated by 45° clockwise from the Y direction.

In the magnetic sensor of the present embodiment shown in FIG. 15B, the planar shape of the magnetic layer of the AMR element R21 is a rectangle with the longer sides rotated by an angle smaller than 45° counterclockwise from the Y direction, while the planar shape of the magnetic layer of the AMR element R22 is a rectangle with the longer sides rotated by an angle smaller than 45° clockwise from the Y direction.

Further, the rectangles or the planar shapes of the magnetic layers of the AMR elements R11, R12, R21 and R22 in the magnetic sensor of the comparative example have the same size. The rectangles or the planar shapes of the magnetic layers of the AMR elements R11, R12, R21 and R22 in the magnetic sensor of the present embodiment are different from those of the comparative example in size. In both of the magnetic sensor of the comparative example and the magnetic sensor of the present embodiment, current flows through the AMR elements R11, R12, R21 and R22 in the longitudinal direction (the direction of the longer sides) of the magnetic layers thereof.

In the present embodiment, the first direction D1, which is the direction in which the magnetization direction of the magnetic layer is pinned when the magnetic sensor system is in the non-operating state, shall be the X direction. In the magnetic sensor of the present embodiment, the magnetic layer of each of the AMR elements R11, R12, R21 and R22 has the preset induced magnetic anisotropy. According to the present embodiment, this allows the total amount of increase in the angle error and the amount of increase in the angle error per unit time after the start of use of the magnetic sensor system to be smaller than in the case where no preset induced magnetic anisotropy is imparted to the magnetic layer.

For the magnetic sensor of the comparative example, it is assumed that the magnetic layer of each of the AMR elements R11, R12, R21 and R22 has the preset induced magnetic anisotropy, as with magnetic sensor of the present embodiment. However, the magnetic sensor of the comparative example is assumed to have an angle error resulting from the preset induced magnetic anisotropy. In the present embodiment, the angle error resulting from the preset induced magnetic anisotropy is corrected by adjusting the magnitude of the shape magnetic anisotropy and the location of the magnetic layer. This will be described in detail below.

The planar shape of the magnetic layer of the AMR element R11 of FIG. 15B is geometrically similar to, but smaller than, the planar shape of the magnetic layer of the AMR element R11 of FIG. 15A. Making the planar shape of the magnetic layer smaller in size while keeping the geometrical similarity like this example causes an increase in the influence of a static magnetic field in the magnetic layer and an increase in the magnitude of an anisotropy field resulting from the shape magnetic anisotropy in the longitudinal direction of the magnetic layer which is parallel to the Y direction. Thus, the magnetic layer of the AMR element R11 of FIG. 15B has a greater anisotropy field resulting from the shape magnetic anisotropy in a direction parallel to the Y direction, when compared with the magnetic layer of the AMR element R11 of FIG. 15A.

On the other hand, the planar shape of the magnetic layer of the AMR element R12 of FIG. 15B is geometrically similar to, but larger than, the planar shape of the magnetic layer of the AMR element R12 of FIG. 15A. Making the planar shape of the magnetic layer larger in size while keeping the geometrical similarity like this example causes a decrease in the influence of a static magnetic field in the magnetic layer and a decrease in the magnitude of an anisotropy field resulting from the shape magnetic anisotropy in the longitudinal direction of the magnetic layer which is parallel to the X direction. Thus, the magnetic layer of the AMR element R12 of FIG. 15B has a smaller anisotropy field resulting from the shape magnetic anisotropy in a direction parallel to the X direction, when compared with the magnetic layer of the AMR element R12 of FIG. 15A.

Consequently, as compared with the detection circuit 10 of FIG. 15A, the detection circuit 10 of FIG. 15B is capable of increasing the magnitude of the shape magnetic anisotropy of the magnetic layers of the AMR elements R11 and R12 in a direction parallel to the Y direction, and thus capable of better reducing an error occurring in the first signal S1 due to the preset induced magnetic anisotropy.

The planar shape of the magnetic layer of each of the AMR elements R21 and R22 of FIG. 15B is geometrically similar to, but smaller than, the planar shape of the magnetic layer of each of the AMR elements R21 and R22 of FIG. 15A. Further, the angle that the longitudinal direction of the magnetic layer of each of the AMR elements R21 and R22 of FIG. 15B forms with respect to the Y direction is smaller than the angle that the longitudinal direction of the magnetic layer of each of the AMR elements R21 and R22 of FIG. 15B forms with respect to the Y direction. Thus, the magnetic layer of each of the AMR elements R21 and R22 of FIG. 15B has a greater anisotropy field resulting from the shape magnetic anisotropy in a direction parallel to the Y direction, when compared with the magnetic layer of each of the AMR elements R21 and R22 of FIG. 15A. Consequently, as compared with the detection circuit 20 of FIG. 15A, the detection circuit 20 of FIG. 15B is capable of better reducing an error occurring in the second signal S2 due to the preset induced magnetic anisotropy.

From the foregoing, as compared with the magnetic sensor of the comparative example, the magnetic sensor of the present embodiment is capable of better reducing the angle error resulting from the preset induced magnetic anisotropy.

The other configuration, operation, and effects of the present embodiment are the same as those of the first embodiment.

The present invention is not limited to the foregoing embodiments, and various modifications may be made thereto. For example, the magnetic detection element of the present invention is not limited to a spin-valve MR element (a GMR element or a TMR element) or an AMR element, and may be any element that has a magnetic layer whose magnetization direction varies according to the direction of the target magnetic field. The magnetic detection element may be, for example, a Hall element that includes a ferromagnetic layer and uses the ferromagnetic Hall effect.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetic sensor system comprising:
a magnetic field generation unit for generating a magnetic field to be detected; and
a magnetic sensor for detecting the magnetic field,
the magnetic sensor system being selectable between an operating state and a non-operating state, wherein
the magnetic sensor has a magnetic detection element, and generates a detected value having a correspondence relationship with an angle that a direction of the magnetic field in a reference position forms with respect to a reference direction,
the magnetic detection element includes a magnetic layer whose magnetization direction varies according to the direction of the magnetic field in the reference position,
when the magnetic sensor system is in the operating state, the direction of the magnetic field in the reference position varies when viewed from the magnetic sensor,
when the magnetic sensor system is in the non-operating state, the direction of the magnetic field in the reference position does not vary when viewed from the magnetic sensor and is pinned in firs direction, and consequently the magnetization direction of the magnetic layer is pinned in the first direction,
the magnetic layer has an induced magnetic anisotropy that is imparted in advance to the magnetic layer, the induced magnetic anisotropy being oriented to reduce error caused by a posteriori induced magnetic anisotropy resulting from the magnetic field generation unit, and
an easy axis of magnetization resulting from the induced magnetic anisotropy imparted to the magnetic layer is oriented in a direction that forms an angle in the range of 0° to 15° with respect to the first direction.

2. The magnetic sensor system according to claim 1, wherein
when the magnetic sensor system is in the operating state, the magnetic field generation unit and the magnetic sensor are in a varying relative positional relationship with each other, and
when the magnetic sensor system is in the non-operating state, the magnetic field generation unit and the magnetic sensor are in a fixed relative positional relationship with each other.

3. The magnetic sensor system according to claim 1, wherein the magnetic sensor makes a correction of an error that occurs in the detected value due to the induced magnetic anisotropy imparted to the magnetic layer.

4. The magnetic sensor system according to claim 3, wherein the correction of the error is implemented by a shape magnetic anisotropy imparted to the magnetic layer.

5. The magnetic sensor system according to claim 4, wherein an easy axis of magnetization resulting from the shape magnetic anisotropy is oriented in a direction that forms an angle in the range of 75° to 90° with respect to both of the first direction and the direction of the easy axis of magnetization resulting from the induced magnetic anisotropy.

6. The magnetic sensor system according to claim 3, wherein the magnetic sensor includes an arithmetic circuit for making the correction of the error.

* * * * *